US010355149B2

(12) United States Patent
Chang et al.

(10) Patent No.: US 10,355,149 B2
(45) Date of Patent: Jul. 16, 2019

(54) TANDEM SOLAR CELL MODULE

(71) Applicant: Industrial Technology Research Institute, Hsinchu (TW)

(72) Inventors: Chia-Wen Chang, New Taipei (TW); Yung-Tsung Liu, Taipei (TW); Wei-Sheng Lin, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 28 days.

(21) Appl. No.: 15/271,240

(22) Filed: Sep. 21, 2016

(65) Prior Publication Data

US 2017/0365728 A1 Dec. 21, 2017

(30) Foreign Application Priority Data

Jun. 17, 2016 (TW) .............................. 105119061 A

(51) Int. Cl.
*H01L 31/0224* (2006.01)
*H01L 31/02* (2006.01)
*H01L 31/043* (2014.01)

(52) U.S. Cl.
CPC .. *H01L 31/022425* (2013.01); *H01L 31/0201* (2013.01); *H01L 31/022466* (2013.01); *H01L 31/043* (2014.12); *Y02E 10/50* (2013.01)

(58) Field of Classification Search
CPC ......... H01L 31/022425; H01L 31/0201; H01L 31/022466
USPC ....................................................... 136/256
See application file for complete search history.

(56) References Cited

U.S. PATENT DOCUMENTS

| 5,021,099 | A | * | 6/1991 | Kim | ...................... H01L 31/042 136/244 |
|---|---|---|---|---|---|
| 2011/0146759 | A1 | | 6/2011 | Lee et al. | |
| 2011/0259395 | A1 | | 10/2011 | Wieting et al. | |
| 2012/0103669 | A1 | | 5/2012 | Pruneri et al. | |
| 2012/0204939 | A1 | * | 8/2012 | Lee | ..................... H01L 31/0749 136/249 |

(Continued)

FOREIGN PATENT DOCUMENTS

| CN | 1883055 | 12/2006 |
|---|---|---|
| CN | 102124571 | 7/2011 |

(Continued)

OTHER PUBLICATIONS

"Office Action of Taiwan Counterpart Application", dated Dec. 12, 2016, p. 1-p. 5, in which the listed references were cited.

(Continued)

*Primary Examiner* — Matthew T Martin
(74) *Attorney, Agent, or Firm* — JCIPRNET

(57) ABSTRACT

A tandem solar cell module includes a transparent substrate, a first solar cell unit, and a second solar cell unit disposed between the transparent substrate and the first solar cell unit. The first solar cell unit includes a first electrode, a second electrode, and a first absorption layer disposed between the first electrode and the second electrode, and the second solar cell unit includes a third electrode, a fourth electrode, and a second absorption layer disposed between the third electrode and the fourth electrode, wherein the second electrode is located adjacent to the third electrode, and the positions of the second electrode, the third electrode, and the fourth electrode are corresponding to each other.

19 Claims, 5 Drawing Sheets

(56) References Cited

U.S. PATENT DOCUMENTS

| | | | | |
|---|---|---|---|---|
| 2013/0180586 | A1* | 7/2013 | Maehara | B82Y 10/00 |
| | | | | 136/256 |
| 2014/0124014 | A1 | 5/2014 | Morad et al. | |
| 2015/0228831 | A1 | 8/2015 | Rostan et al. | |
| 2017/0323993 | A1* | 11/2017 | Bjork | H01L 31/02363 |

FOREIGN PATENT DOCUMENTS

| | | |
|---|---|---|
| CN | 102484150 | 5/2012 |
| CN | 102568867 | 7/2012 |
| CN | 202423306 | 9/2012 |
| CN | 103066151 | 4/2013 |
| CN | 104269451 | 1/2015 |
| CN | 104641473 | 5/2015 |
| CN | 104919597 | 9/2015 |
| DE | 202011104896 | 1/2012 |
| EP | 0848433 | 6/1998 |
| EP | 2259329 | 12/2010 |
| FR | 2837625 | 9/2003 |
| TW | 200921960 | 5/2009 |
| TW | 201228063 | 7/2012 |
| WO | 2010136393 | 12/2010 |
| WO | 2010136393 | 2/2011 |

OTHER PUBLICATIONS

Braun et al., "Multi-busbar Solar Cells and Modules: High Efficiencies and Low Silver Consumption," Energy Procedia, Mar. 25-27, 2013, pp. 334-339.

Filipič et al., "CH3NH3PbI3 perovskite/silicon tandem solar cells: characterization based optical simulations," Optics Express, Feb. 27, 2015, pp. A263-A278.

Albrecht., "Monolithic perovskite/silicon-heterojunction tandem solar cells processed at low temperature," Energy & Environmental Science, Oct. 27, 2015, pp. 81-88.

Werner et al., "Sputtered rear electrode with broadband transparency for perovskite solar cells," Solar Energy Materials and Solar Cells, Jun. 27, 2015, pp. 407-413.

Office Action of China Counterpart Application, dated Aug. 31, 2018, pp. 1-9.

* cited by examiner

TANDEM SOLAR CELL MODULE

CROSS-REFERENCE TO RELATED APPLICATION

This application claims the priority benefit of Taiwan application serial no. 105119061, filed on Jun. 17, 2016. The entirety of the above-mentioned patent application is hereby incorporated by reference herein and made a part of this specification.

TECHNICAL FIELD

The present disclosure relates to a tandem solar cell module.

BACKGROUND

A conventional tandem solar cell is made by stacking two or more solar cell devices with the same energy gap or different energy gaps, so as to fabricate a tandem solar cell module. In the design, the solar cell device absorbing high energy spectrum is generally placed at an upper layer, and the solar cell device absorbing low energy spectrum is placed at a bottom cell. The sunlight spectral energy is absorbed layer by layer through different materials of light absorption layers, so as to improve the efficiency of the cell module.

With a silicon crystal solar cell, which has the largest market share currently, as an example, to effectively utilize the incident light with short wavelength which is not absorbed by the silicon crystal solar cell, the cell with a wide energy gap higher than the silicon crystal is stacked above the silicon crystal solar cell, so as to improve the efficiency of the cell module. However, the design of the electrode of the cell at the upper layer is generally based on an entire surface transparent conductive oxide (TCO), and the purpose is to make the upper cell become a transmission type cell device, such that the spectrum with long wavelength passes through the upper cell and then reaches the bottom cell (the silicon crystal cell) to be absorbed. Thus, not only the absorption layer of the upper cell can absorb the incident light with short wavelength, but also the entire surface transparent conductive oxide electrode of the upper cell can shield or absorb parts of the light. It may cause the reduction of the amount or the intensity of incident light entering the silicon crystal cell, which is not helpful for the absorption of the material of the light absorption layer at the bottom cell.

SUMMARY

The present disclosure provides a tandem solar cell module including a transparent substrate, a first solar cell unit, and a second solar cell unit disposed between the transparent substrate and the first solar cell unit. The first solar cell unit includes a first electrode, a second electrode, and a first absorption layer disposed between the first electrode and the second electrode. The second solar cell unit includes a third electrode, a fourth electrode, and a second absorption layer disposed between the third electrode and the fourth electrode, wherein the second electrode is located adjacent to the third electrode, and the positions of the second electrode, the third electrode, and the fourth electrode are corresponding to each other.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The embodiments of the concepts of the present disclosure are described more fully hereinafter with reference to the accompanying drawings, but the present disclosure may be embodied in many other different forms. For clarity, the relative sizes and positions of each structure and region may be reduced or enlarged in figures. It should be understood that although "the first", "the second", and the like, are used to describe different structures and regions, these structures or regions should not be construed as limited to the wording. That is, the first surface, region, or structure discussed below may be called as the second surface, region, or structure, and will not disobey the teaching of the embodiments.

Figure 1A:
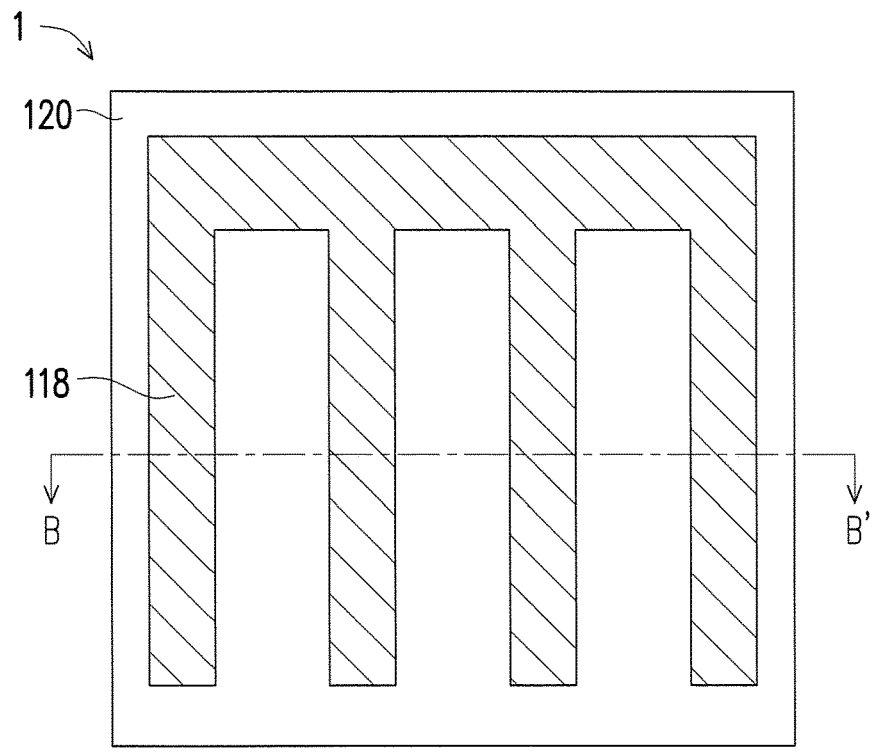
FIG. 1A is a top view of a solar cell module according to a first embodiment of the present disclosure.
Figure 1B:
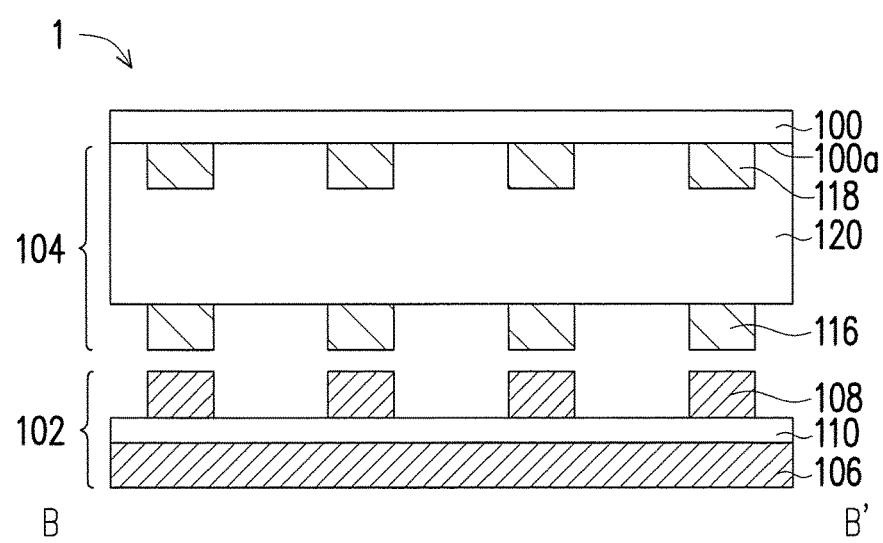
FIG. 1B is a schematic cross-sectional view according to a line B-B' of FIG. 1A.

FIG. 1A is a top view of a solar cell module according to a first embodiment of the present disclosure. FIG. 1B is a schematic cross-sectional view according to a line B-B' of FIG. 1A. Referring to FIG. 1A and FIG. 1B, a tandem solar cell module 1 of the first embodiment includes a transparent substrate 100, a first solar cell unit 102, and a second solar cell unit 104, wherein the transparent substrate 100 is glass or a plastic, for example. The first solar cell unit 102 is disposed at an opposite surface 100a of the transparent substrate 100 irradiated by light. That is, if the light is incident from a front surface of the transparent substrate 100, the position of the first solar cell unit 102 is at a back surface of the transparent substrate 100. The first solar cell unit 102 includes a first electrode 106, a second electrode 108, and a first absorption layer 110 disposed between the first electrode 106 and the second electrode 108. The first electrode 106 and the second electrode 108 are disposed on two surfaces of the first absorption layer 110 in a thickness direction respectively, and the second electrode 108 is close to the transparent substrate 100. A material of the first absorption layer 110 includes a Group IV semiconductor material, a Group III-V semiconductor material, a Group I-III-VI semiconductor material, or a Group I-II-IV-VI semiconductor material. The Group IV semiconductor material is silicon, germanium (Ge), or silicon-germanium alloy, for example. The Group III-V semiconductor material is, for example, a binary or ternary compound semiconductor material (e.g., gallium arsenide (GaAs), indium phosphide (InP), gallium nitride (GaN), gallium antimonide (GaSb), indium arsenide (InAs), aluminum phosphide (AlP), aluminum gallium arsenide (AlGaAs), indium gallium arsenide (InGaAs), indium aluminum arsenide (InAlAs), gallium indium phosphide (GaInP), indium gallium phosphide (InGaP), gallium indium nitride (GaInN), etc.). The Group I-III-VI semiconductor material is, for example, a ternary, quaternary, or quintuple compound semiconductor material (e.g., copper indium diselenide ($CuInSe_2$), copper gallium disulfide ($CuGaS_2$), copper indium-gallium diselenide ($Cu(In,Ga)Se_2$), copper indium-gallium diselenide-sulfide ($Cu(In,Ga)(S,Se)_2$)). The Group I-II-IV-VI semiconductor material is, for example, a ternary, quaternary, or quintuple compound semiconductor material (e.g., copper tin selenide ($Cu_2SnSe_3$), copper zinc tin selenide ($Cu_2ZnSnSe_4$), copper zinc tin selenide-sulfide ($Cu_2ZnSn(S,Se)_4$), etc.). The second solar cell unit 104 is disposed between the transparent substrate 100 and the first solar cell unit 102, wherein the second solar cell unit 104 includes a third electrode 116, a fourth electrode 118, and a second absorption layer 120 disposed between the third electrode 116 and the fourth electrode 118. The third electrode 116 and the fourth electrode 118 are disposed on two surfaces of the second absorption layer 120 in a thickness direction respectively, and the second electrode 108 of the first solar cell unit 102 is located adjacent to the third electrode 116 of the second solar cell unit 104. The positions of the second electrode 108, the third electrode 116, and the fourth electrode 118 are corresponding to each other. For example, when sunlight is incident from the transparent substrate 100 into the tandem solar cell module 1, it passes through the transparent substrate 100 and the second solar cell unit 104 first, and then it enters the first solar cell unit 102. Since the positions of the electrodes (116, 118) of the second solar cell unit 104 are corresponding to the position of the electrode (108) of the first solar cell unit 102 in a vertical direction, a light path for entering the first solar cell unit 102 is not additionally shielded by the design of the electrode of the second solar cell unit 104. Thus, in comparison with the design of normal fully-covered transparent conductive oxide electrode, the amount or the intensity of light that is shielded or absorbed is less. The embodiment can increase the absorption of spectral energy of the first solar cell unit.

In another embodiment, the shapes of the second electrode 108, the third electrode 116, and the fourth electrode 118 may be corresponding to each other. Alternatively, the dimensions of the second electrode 108, the third electrode 116, and the fourth electrode 118 may be corresponding to each other. Therefore, no matter the positions, the shapes, or the dimensions of the second electrode 108, the third electrode 116, and the fourth electrode 118 are corresponding to each other, and thus the area of the shielded sunlight can be shrunk. That is, when a plurality of the solar cell units are vertically stacked together, and the setting positions, the setting shapes, and the setting dimensions of the upper and lower electrodes (e.g., the second electrode 108, the third electrode 116, and the fourth electrode 118) of each independent solar cell unit are corresponding to each other in the vertical direction of the tandem solar cell module, the area of the shielded sunlight is the smallest. Thus, the shielding area of the upper electrode has minimal impact on light absorption of the material of the light absorption layer of the lower solar cell unit.

Referring to FIG. 1B, the manufacturing method of the tandem solar cell module 1 of the first embodiment, for example, the first solar cell unit 102 may be formed first, and then the second solar cell unit 104 is formed. After that, the second electrode 108 of the first solar cell unit 102 and the third electrode 116 of the second solar cell unit 104 are stacked together corresponding to each other in the vertical direction, such that the second electrode 108 of the first solar cell unit 102 is located adjacent to the third electrode 116 of the second solar cell unit 104. Also, the positions of the second electrode 108, the third electrode 116, and the fourth electrode 118 are corresponding to each other.

For example, the transparent substrate 100 may be served as the substrate of the second solar cell unit 104. Thus, the second absorption layer 120 of the second solar cell unit 104 completely covers the fourth electrode 118 and the transparent substrate 100.

In an embodiment, a material of the second absorption layer 120 of the second solar cell unit 104 includes a Group III-V semiconductor material, a Group II-VI semiconductor material, a Group I-II-IV-VI semiconductor material, a Group I-III-VI semiconductor material, an organic polymer material, and an organic-inorganic hybrid material, etc. An energy gap of the material of the second absorption layer 120 is between 1.1 eV and 1.9 eV, which is helpful to absorb the high energy spectrum. In another embodiment, the energy gap of the material of the second absorption layer 120 is between 1.5 eV and 1.8 eV. Thus, after the sunlight enters the transparent substrate 100, the tandem solar cell module 1 can use the second solar cell unit 104 to absorb the incident light with short wavelength, and let the light enter the first solar cell unit 102 to absorb the incident light with long wavelength, so as to achieve the tandem solar cell module which makes more full use of the solar energy spectrum.

In an embodiment, materials of the second electrode 108, the third electrode 116, and the fourth electrode 118 independently include metal, a conductive polymer, an organic-inorganic hybrid conductive material, or a polar conductive material, wherein the metal material includes molybdenum (Mo), gold (Au), silver (Ag), aluminum (Al), copper (Cu), nickel (Ni), or a combination thereof.

Figure 2:
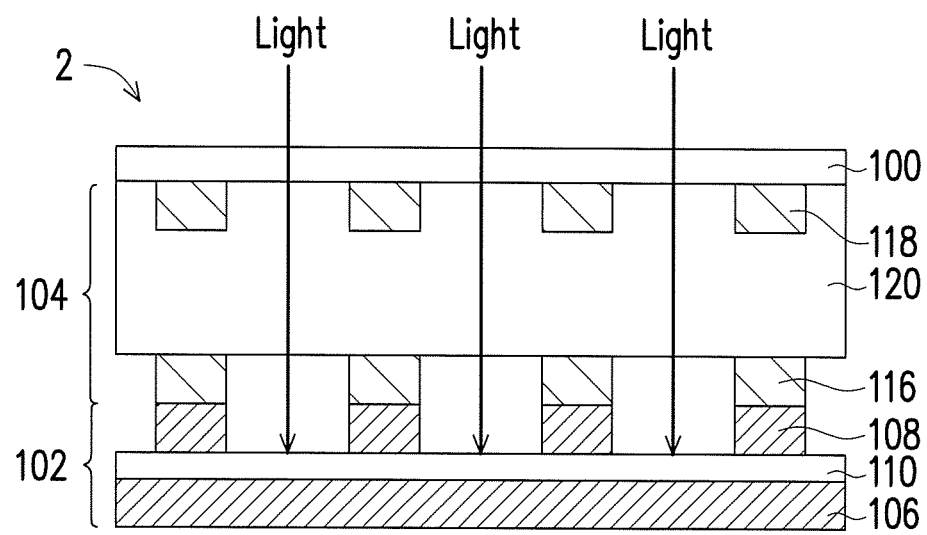
FIG. 2 is a schematic cross-sectional view of a tandem solar cell module according to a second embodiment of the present disclosure.
Figure 3:
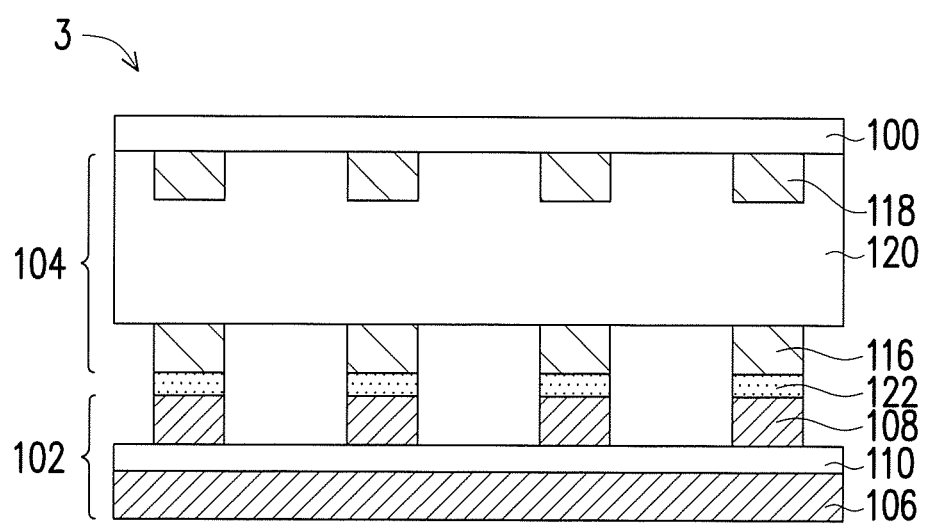
FIG. 3 is a schematic cross-sectional view of a tandem solar cell module according to a third embodiment of the present disclosure.

FIG. 2 is a schematic cross-sectional view of a tandem solar cell module according to a second embodiment of the present disclosure, wherein the component notations the same as FIG. 1B are used to represent the same or similar components. FIG. 3 is a schematic cross-sectional view of a tandem solar cell module according to a third embodiment of the present disclosure, wherein the component notations the same as FIG. 1B are used to represent the same or similar components.

Referring to FIG. 2, the difference between a tandem solar cell module 2 of the second embodiment and FIG. 1B is that, the electrical connection relationship between the first solar cell unit 102 and the second solar cell unit 104. The third electrode 116 of the second solar cell unit 104 is electrically connected to the second electrode 108 of the first solar cell unit 102 in the second embodiment. Thus, the second electrode 108 may be in direct contact with the third electrode 116.

Alternatively, referring to FIG. 3, the difference between the third embodiment and FIG. 1B is that, a tandem solar cell module 3 of the third embodiment further includes a conductive material 122 disposed between the second electrode 108 and the third electrode 116, such that the second electrode 108 is electrically connected to the third electrode 116. Also, a circuit series connection between the second solar cell unit 104 and the first solar cell unit 102 is formed. The conductive material 122 is, for example, a conductive paste.

Figure 4:
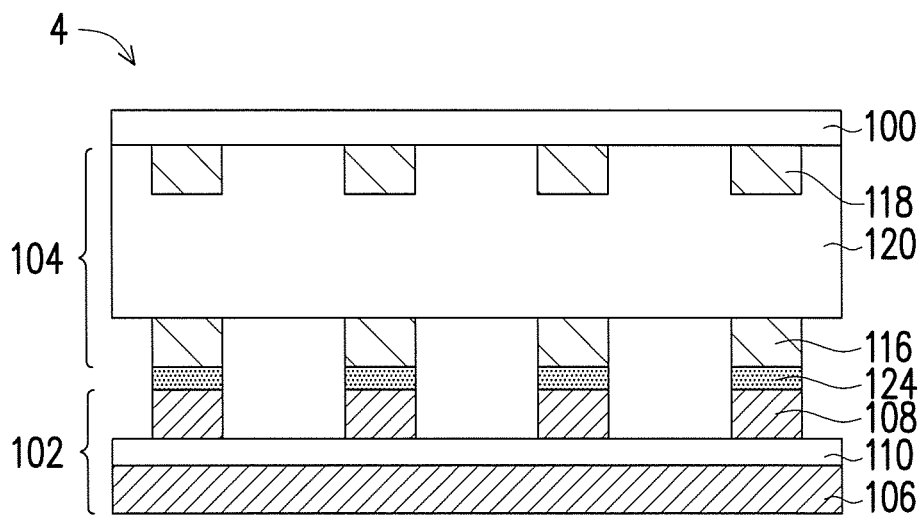
FIG. 4 is a schematic cross-sectional view of a tandem solar cell module according to a fourth embodiment of the present disclosure.
Figure 5:
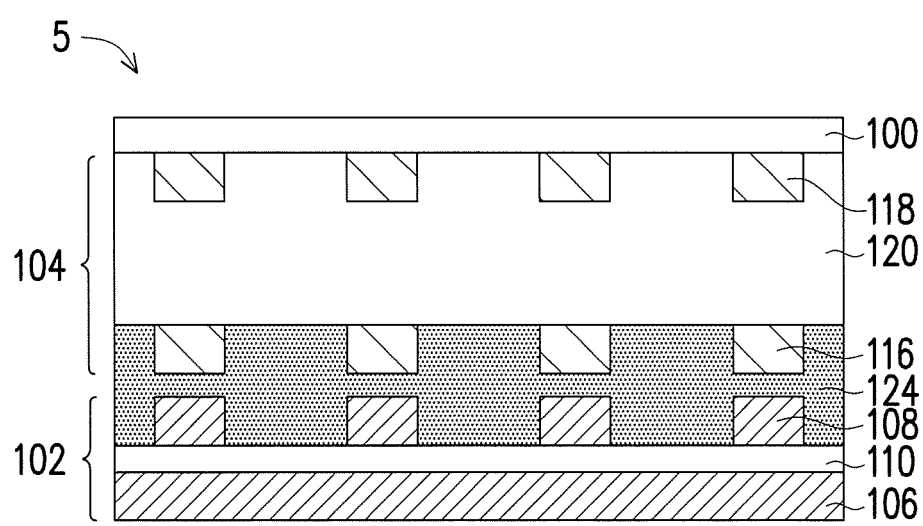
FIG. 5 is a schematic cross-sectional view of a tandem solar cell module according to a fifth embodiment of the present disclosure.

FIG. 4 is a schematic cross-sectional view of a tandem solar cell module according to a fourth embodiment of the present disclosure, wherein the component notations the same as FIG. 1B are used to represent the same or similar components. FIG. 5 is a schematic cross-sectional view of a tandem solar cell module according to a fifth embodiment of the present disclosure, wherein the component notations the same as FIG. 1B are used to represent the same or similar components.

Referring to FIG. 4, the difference between a tandem solar cell module 4 of the fourth embodiment and FIG. 1B is that, the third electrode 116 of the second solar cell unit 104 is not electrically connected to the second electrode 108 of the first solar cell unit 102 in the embodiment. Thus, in the fourth embodiment, it further includes a spacer 124 disposed between the second electrode 108 and the third electrode 116, such that the second electrode 108 is not electrically connected to the third electrode 116. Alternatively, referring to FIG. 5, the difference between a tandem solar cell module 5 of the fifth embodiment and FIG. 1B is that, the spacer 124 is further disposed between the first absorption layer 110, the second electrode 108, the second absorption layer 120, and the third electrode 116 in the embodiment, and the second electrode 108 is not electrically connected to the third electrode 116. At the same time, the first absorption layer 110, the second electrode 108, the second absorption layer 120, and the third electrode 116 may also be protected by the spacer 124 and be isolated from air. In the embodiment, the spacer 124 includes an insulating material, such as an insulating paste.

Figure 6:
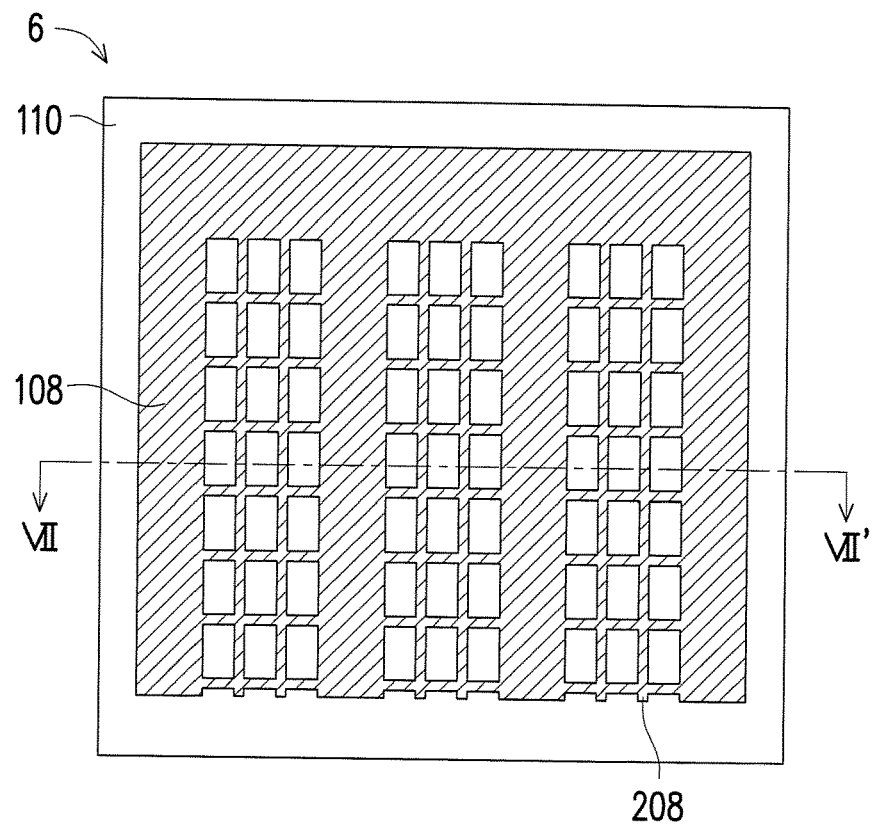
FIG. 6 is a top view of a tandem solar cell module according to a sixth embodiment of the present disclosure.
Figure 7A:
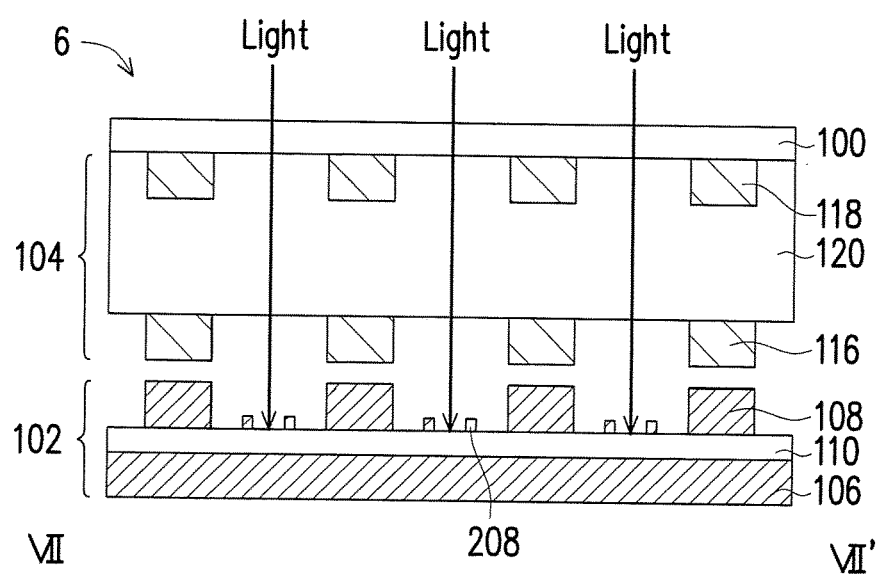
FIG. 7A to FIG. 7C are schematic cross-sectional views illustrating various embodiments according to a line VII-VII' of FIG. 6 of the sixth embodiment of the present disclosure.
Figure 7B:
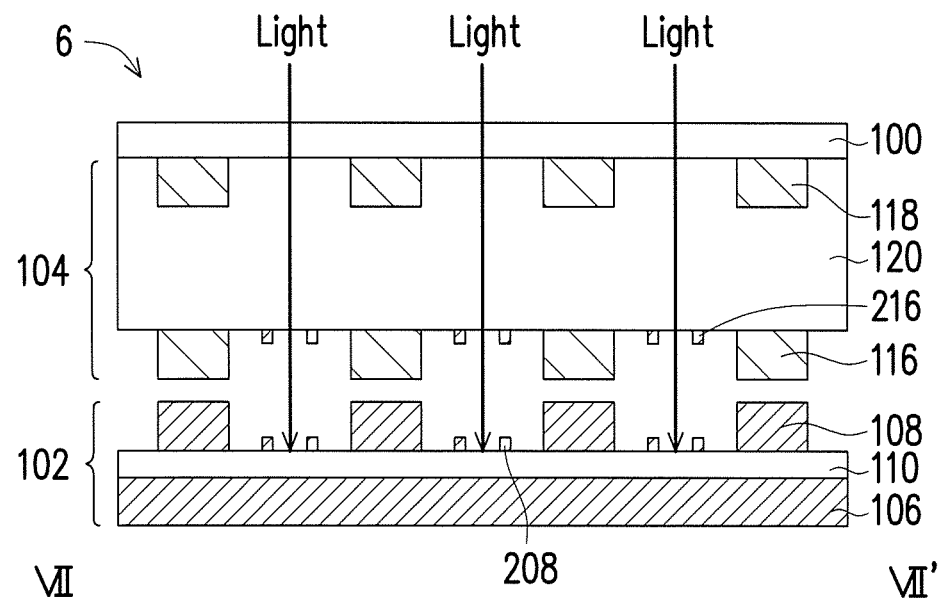
Figure 7C:
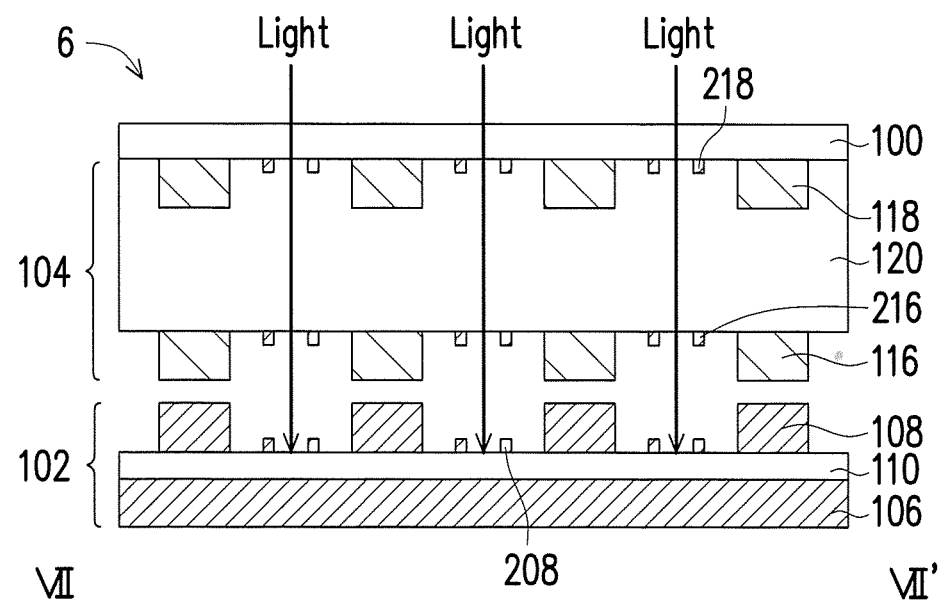

FIG. 6 is a top view of a tandem solar cell module according to a sixth embodiment of the present disclosure, wherein the component notations the same as FIG. 1A to FIG. 1B are used to represent the same or similar components, and only the first solar cell unit 102 is shown. FIG. 7A to FIG. 7C are schematic cross-sectional views illustrating various embodiments according to a line VII-VII' of FIG. 6 of the sixth embodiment of the present disclosure, and the component notations the same as FIG. 6 are used to represent the same or similar components.

Referring to FIG. 6 and FIG. 7A, in a tandem solar cell module 6, the sunlight enters from the transparent substrate 100. The difference between the tandem solar cell module 6 and tandem solar cell module 1 in FIG. 1A is that, in an embodiment, referring to FIG. 7A, the first solar cell unit 102 further includes a first bus line 208 disposed on the first absorption layer 110 and at the same side of the second electrode 108. The first bus line 208 is electrically connected to the second electrode 108. In an embodiment, referring to FIG. 7B, the second solar cell unit 102 further includes a second bus line 216 disposed on the second absorption layer 120 and at the same side of the third electrode 116, and the second bus line 216 is electrically connected to the third electrode 116. In an embodiment, referring to FIG. 7C, the second solar cell unit 102 further includes a third bus line 218 disposed on the second absorption layer 120 and at the same side of the fourth electrode 118, and the third bus line 218 is electrically connected to the fourth electrode 118. For example, the first bus line 208, the second bus line 216, and the third bus line 218 can offer the second electrode 108, the third electrode 116, and the fourth electrode 118 to collect carriers more effectively. Also, in the practical design, the first bus line 208, the second bus line 216, and the third bus line 218 are required to reduce the proportion of shielding the incident light. Thus, the first bus line 208, the second bus line 216, and the third bus line 218 can be simultaneously disposed in the tandem solar cell module, or independently disposed or assembly disposed in the tandem solar cell module according to actual needs.

To reduce the proportion of shielding the incident light, in the embodiment, the positions of the first bus line 208 and the second bus line 216 are corresponding to each other. In another embodiment, the positions of the first bus line 208, the second bus line 216, and the third bus line 218 are corresponding to each other, and the purpose thereof is to reduce the proportion of shielding the incident light.

In the embodiment, the first bus line 208, the second bus line 216, and the third bus line 218 include a linear structure, a network structure, or a patterned structure, wherein a line width of the linear structure is 10 nm to 100 μm. The design patterns of the bus lines, the linear structures, the network structures, or the patterned structures may be different according to actual usage, and the purpose is to collect the carriers more effectively and then transmit onto the electrode.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A tandem solar cell module, comprising:
a transparent substrate;
a first solar cell unit, comprises a first electrode, a second electrode, a first bus line at the same side of the second electrode, and a first absorption layer disposed between the first electrode and the second electrode, wherein the first bus line is parallel to the second electrode, and a line width of the first bus line is smaller than that of the second electrode; and
a second solar cell unit, disposed between a surface of the transparent substrate and the first solar cell unit, and the second solar cell unit comprises a third electrode, a second bus line at the same side of the third electrode, a fourth electrode, a third bus line at the same side of the fourth electrode, and a second absorption layer disposed between the third electrode and the fourth electrode, wherein the second bus line is parallel to the third electrode, a line width of the second bus line is smaller than that of the third electrode, the third bus line is parallel to the fourth electrode, a line width of the third bus line is smaller than that of the fourth electrode, the second electrode is located adjacent to the third electrode, the fourth electrode is disposed on a portion of the surface of the transparent substrate to expose another portion of the surface of the transparent substrate, the second electrode, the fourth electrode is in direct contact with the surface of the transparent substrate, the third electrode and the fourth electrode are arranged vertically such that each of the second electrode, the third electrode and the fourth electrode aligns in a parallel plane, and the second electrode, the third electrode and the fourth electrode are not completely covering either the first absorption layer or the transparent substrate.

2. The tandem solar cell module according to claim 1, wherein shapes of the second electrode, the third electrode, and the fourth electrode are the same.

3. The tandem solar cell module according to claim 1, wherein dimensions of the second electrode, the third electrode, and the fourth electrode are the same.

4. The tandem solar cell module according to claim 1, wherein the first bus line is disposed on the first absorption layer, and the first bus line is electrically connected to the second electrode.

5. The tandem solar cell module according to claim 1, wherein the second bus line is disposed on the second absorption layer, and the second bus line is electrically connected to the third electrode.

6. The tandem solar cell module according to claim 1, wherein the third bus line is disposed on the second absorption layer, and the third bus line is electrically connected to the fourth electrode.

7. The tandem solar cell module according to claim 1, wherein the first bus line and the second bus line are arranged vertically such that each of the first bus line and the second bus line aligns in a parallel plane.

8. The tandem solar cell module according to claim 1, wherein the first bus line, the second bus line and the third bus line are arranged vertically such that each of the first bus line, the second bus line and the third bus line aligns in a parallel plane.

9. The tandem solar cell module according to claim 1, wherein the first bus line, the second bus line, and the third bus line comprise a linear structure.

10. The tandem solar cell module according to claim 1, wherein the line width of the first bus line, the second bus line, and the third bus line is 10 nm to 100 μm.

11. The tandem solar cell module according to claim 1, wherein the second electrode is or not electrically connected to the third electrode.

12. The tandem solar cell module according to claim 11, further comprising a conductive material disposed between the second electrode and the third electrode, such that the second electrode is electrically connected to the third electrode.

13. The tandem solar cell module according to claim 11, further comprising a spacer disposed between the second electrode and the third electrode, such that the second electrode is not electrically connected to the third electrode.

14. The tandem solar cell module according to claim 13, wherein the spacer is further disposed between the first absorption layer and the second absorption layer, such that the second electrode is not electrically connected to the third electrode.

15. The tandem solar cell module according to claim 13, wherein the spacer comprises an insulating material.

16. The tandem solar cell module according to claim 1, wherein a material of the first absorption layer comprises a Group IV semiconductor material, a Group III-V semiconductor material, a Group I-III-VI semiconductor material, or a Group I-II-IV-VI semiconductor material.

17. The tandem solar cell module according to claim 1, wherein a material of the second absorption layer comprises a Group III-V semiconductor material, a Group II-VI semiconductor material, a Group I-II-IV-VI semiconductor material, a Group I-III-VI semiconductor material, an organic polymer material, or an organic-inorganic hybrid material.

18. The tandem solar cell module according to claim 1, wherein materials of the second electrode, the third electrode, and the fourth electrode independently comprise metal, a conductive polymer, an organic-inorganic hybrid conductive material, or a polar conductive material.

19. The tandem solar cell module according to claim 18, wherein the metal comprises molybdenum (Mo), gold (Au), silver (Ag), aluminum (Al), copper (Cu), nickel (Ni), or a combination thereof.

* * * * *